(12) United States Patent
Brun et al.

(10) Patent No.: US 10,788,793 B2
(45) Date of Patent: Sep. 29, 2020

(54) ATTACHMENT METHOD USING ANODIC BONDING

(71) Applicant: SY & SE Sàrl, La Chaux-de-Fonds (CH)

(72) Inventors: Sébastien Brun, Vilars (CH); Michael Stuer, Neuchâtel (CH)

(73) Assignee: SY & SE SA (CH)

( * ) Notice: Subject to any disclaimer, the term of this patent is extended or adjusted under 35 U.S.C. 154(b) by 27 days.

(21) Appl. No.: 15/741,085

(22) PCT Filed: Jun. 29, 2016

(86) PCT No.: PCT/IB2016/053871
§ 371 (c)(1),
(2) Date: Dec. 29, 2017

(87) PCT Pub. No.: WO2017/006218
PCT Pub. Date: Jan. 12, 2017

(65) Prior Publication Data
US 2018/0188692 A1    Jul. 5, 2018

(30) Foreign Application Priority Data

Jul. 6, 2015    (CH) .................................... 00977/15

(51) Int. Cl.
*B29C 65/00*    (2006.01)
*G04B 39/02*    (2006.01)
(Continued)

(52) U.S. Cl.
CPC ............ *G04B 39/025* (2013.01); *C03C 27/02* (2013.01); *C03C 27/06* (2013.01); *G04B 37/22* (2013.01);
(Continued)

(58) Field of Classification Search
CPC ...... G04B 37/11; G04B 37/22; G04B 39/002; G04B 39/006; G04B 39/02; G04B 39/025;
(Continued)

(56) References Cited

U.S. PATENT DOCUMENTS 3,397,278 A * 8/1968 Pomerantz .............. C03C 27/02
257/650
8,902,123 B2 * 12/2014 Dairiki ................ H01L 21/6835
343/893

(Continued)

FOREIGN PATENT DOCUMENTS

BE          680529       11/1966
CH          678680 A     10/1991
(Continued)

OTHER PUBLICATIONS

Translation of WO2015104252 (Year: 2015).*

*Primary Examiner* — Mark A Osele
*Assistant Examiner* — Nickolas R Harm
(74) *Attorney, Agent, or Firm* — Blank Rome LLP

(57) ABSTRACT

The invention relates to an anodic bonding method for bonding two elements with an intermediate layer. The invention especially, but not exclusively, relates to an anodic bonding method for between a metallic element and a heterogeneous element, for example a glass, artificial sapphire or ceramic element. The specificity and aim of the present invention is to produce an assembly that is gas-tight and fluid-tight, solderless, brazing- or welder-free and without organic compound (glue). The present method has multiple industrial applications, including making it possible to attach a watch-glass, typically made of mineral glass, (Continued)

sapphire or transparent or translucent ceramics, to a bezel or case middle of a watch case using the anodic bonding technique.

12 Claims, 3 Drawing Sheets

(51) Int. Cl.
| | |
|---|---|
| *C03C 27/02* | (2006.01) |
| *C03C 27/06* | (2006.01) |
| *G04B 37/22* | (2006.01) |
| *B29C 65/04* | (2006.01) |
| *C03C 27/08* | (2006.01) |
| *B23K 1/00* | (2006.01) |
| *G04B 37/11* | (2006.01) |
| *G04B 39/00* | (2006.01) |

(52) U.S. Cl.
CPC .......... *B23K 1/0004* (2013.01); *B29C 65/006* (2013.01); *B29C 65/04* (2013.01); *C03C 27/08* (2013.01); *G04B 37/11* (2013.01); *G04B 39/002* (2013.01); *G04B 39/006* (2013.01); *G04B 39/02* (2013.01)

(58) Field of Classification Search
CPC .......... C03C 27/02; C03C 27/06; C03C 27/08; B29C 65/006; B29C 65/04
USPC .................... 156/272.2, 274.4, 379.7, 380.2
See application file for complete search history.

(56) References Cited

U.S. PATENT DOCUMENTS

| | | | |
|---|---|---|---|
| 2002/0069960 A1* | 6/2002 | Gross | B32B 37/00 156/274.8 |
| 2008/0148849 A1* | 6/2008 | Yoshikawa | G01C 19/56 73/514.15 |
| 2010/0276723 A1* | 11/2010 | Utsumi | H01L 24/75 257/99 |
| 2011/0234052 A1* | 9/2011 | Amano | H03H 3/02 310/344 |
| 2011/0273518 A1* | 11/2011 | Sato | B41J 2/14274 347/70 |
| 2012/0001293 A1* | 1/2012 | Ben Mohamed | H01L 21/76254 257/506 |
| 2012/0146240 A1* | 6/2012 | Dairiki | H01L 21/6835 257/777 |
| 2013/0016587 A1* | 1/2013 | Lee | B06B 1/0292 367/140 |
| 2014/0106095 A1* | 4/2014 | Bianchi | B81C 1/00269 428/34.6 |
| 2014/0246948 A1* | 9/2014 | Lee | G01N 29/2406 310/300 |
| 2015/0158300 A1* | 6/2015 | Ueda | B41J 2/1433 347/9 |

FOREIGN PATENT DOCUMENTS

| | | |
|---|---|---|
| JP | H05-80163 A | 4/1993 |
| JP | H08-166469 A | 6/1996 |
| WO | WO-2015/104252 A2 | 7/2015 |

* cited by examiner

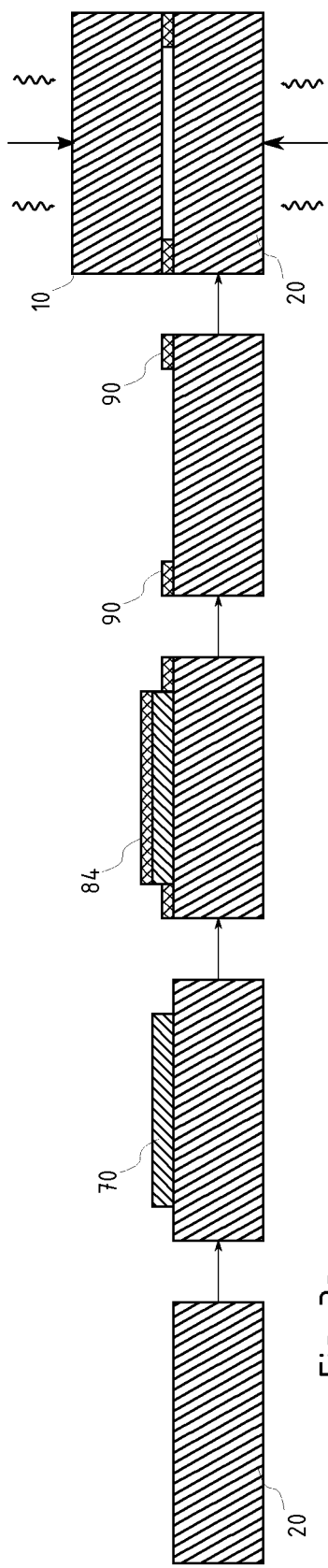
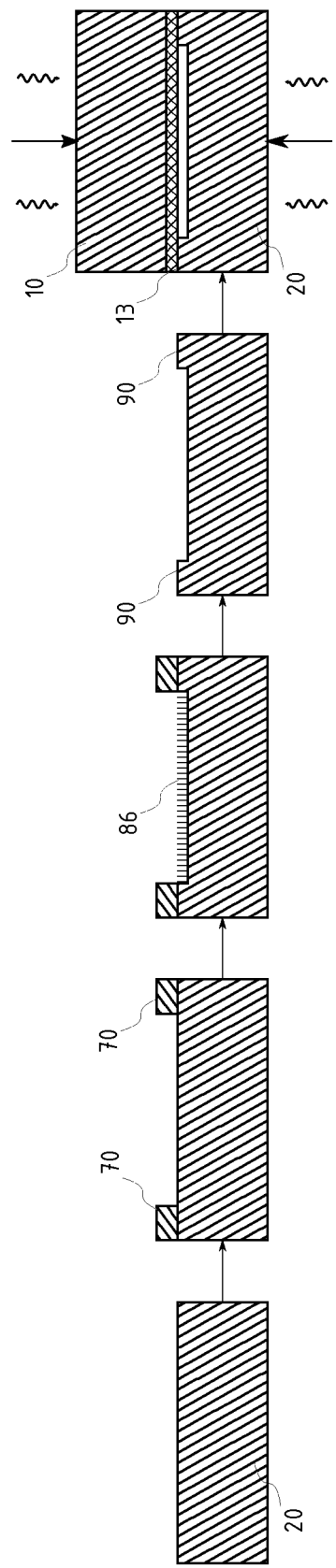
Fig. 3a
Fig. 3b

ATTACHMENT METHOD USING ANODIC BONDING

REFERENCE DATA

The present application is a national phase of international patent application PCT/IB2016/053871 filed Jun. 29, 2016, which claims priority to Swiss application CH00977/15 filed Jul. 6, 2015. The entire contents of those applications are hereby incorporated by reference.

TECHNICAL FIELD

The present invention relates to a method of anodic bonding between two elements with an intermediate layer, in particular, but not exclusively, the present invention relates to a method of anodic bonding between a metal element and a heterogeneous element, such as a glass, a synthetic crystal, such as for example a sapphire, or a ceramic.

The specificity and purpose of the present invention is to produce a seal that is gas-tight, fluid-tight, solderless, brazing-free and without organic compound (glue).

Among its many industrial applications, the present method makes it possible to fix a watch crystal that can be typically made of mineral glass, sapphire or other transparent or translucent ceramics, to a bezel or middle-bezel of a watch case by the technique of anodic bonding. The area of the watch case to which the glass is attached is typically of stainless steel, platinum, gold, titanium or any of the alloys associated with these materials. The aforementioned materials may be indifferently coated with rhodium or any other material used for the manufacture of watch cases or jewelry or jewelry products. The glass may be wholly or partly coated with an antireflection layer without interfering with the bonding process.

The present invention also allows the fastening of the bottom glass. It is also possible, by the method of the invention, to join driving elements to a transparent blade, thus achieving an invisible gear, or a mysterious watch.

STATE OF THE ART

The anodic bonding process is used in the general field of micro technology, more particularly in the biomedical, aerospace and electronics sectors. In these fields, notably in microelectronics and neighboring fields, anodic bonding is mainly used for films and thin and flat layers such as wafers of metal, glass and silicon. Since the process requires relatively high temperatures, it is generally used to join materials with close thermal expansion coefficients, in order to limit the constraints related to contraction differences.

In the known art, the anode assembly is mainly reserved for the joining of glass, in particular Pyrex® or Borofloat® glass (borosilicate glass).

With the same principle of stress limitation, anodic bonding of small size and low mass or of elements not subjected to external mechanical forces has been described in the watch industry in document JP08166469A, for fastening a glass plate on a metallic or silicon dial. Patent JP05080163A also describes the fastening of silicon indexes affixed to a glass plate of the dial by anodic bonding. The known methods, however, do not allow the joining of massive components, subjected to high mechanical stresses, and having to withstand shocks, especially when the parts to be joined are made with heterogeneous materials, with dissimilar expansion coefficients, such as is the case for stainless steel and sapphire used to make watch glasses.

BRIEF SUMMARY OF THE INVENTION

An object of the present invention is to provide an assembly process free from the limitations of known anode bonding processes, in particular a method for obtaining stronger and tighter bonds. Advantageously, the process takes place at a low temperature, well below the transition or melting temperatures of the materials employed.

Another object of the present invention is to provide an anode bonding method that allows the union of heterogeneous materials, without being limited to borosilicate glasses. The assembly described makes it possible to produce metal-to-metal, metal to non-metal and non-metal to non-metal bonds.

It is for example possible to join elements made of stainless steel, titanium, gold, platinum or any other metal, elements of ordinary glass, mineral glass, quartz, synthetic sapphire ($Al_2O_3$), silicon, or transparent or translucent ceramic based on compositions of alumina, yttria, spinel, or other monocrystalline, polycrystalline or amorphous compositions. The low temperatures involved in the process of the invention also allow its application to assemblies comprising elements made of synthetic and/or composite material.

According to the invention, these aims are achieved notably by means of the subject matter of claim 1.

Unlike conventional embodiments, the assembly proposed by the present invention allows the connection of a large number of materials by means of intermediate layers, in order to consolidate the bond, increase the speed of diffusion and allow the joining of a wider range of materials and more massive parts, subjected to high stresses and having to withstand shocks.

Preferably, the intermediate layer is an insulating or semiconducting layer. It may be an insert (for example a thin glass strip) or, preferably, a layer deposited by a physical or chemical deposition process (PVD, PE-CVD, Sol-gel, electroplating). Alternatively, the intermediate layer may be a natural or forced passivation layer, for example an oxide layer on a metal element of steel or titanium.

The elements of the assembly are brought into intimate contact at the atomic level by an electric field of sufficient intensity. It is believed, without wishing to be limited by theory, that the application of an electric field allows the migration of atoms and ions into and from the intermediate layer, as well as the creation of chemical and charge gradients, thus giving rise to covalent and/or ionic bonds between the elements of the assembly. Importantly, the electric field comprises a variable component, pulsed or alternating, and a continuous component. Preferably, the characteristic frequencies of the pulsed or alternating variable component are essentially above the dielectric relaxation frequency of the materials used and are between 0.1 and 100 kHz.

The stability and the strength of the anodic bond can be considerably improved by functionalizing the surfaces before the application of the electric field by plasma bombardment, in particular by oxygen-rich plasmas.

Although the present description has presented examples related to the manufacture of watches, the present invention also allows other applications to watchmaking, and also to jewelry, leather goods, eyewear, and the production of writing instruments. The invention is also not limited to the production of decorative elements, but also allows the assembly of composite technical elements for watch movements, optical instruments, medical devices, and a wide variety of applications, articles and products that use glass or ceramics.

BRIEF DESCRIPTION OF THE FIGURES

Examples of embodiments of the invention are indicated in the description illustrated by the appended figures in which:

FIGS. 3a and 3b show selective masking methods.

EXAMPLE(S) OF EMBODIMENTS OF THE INVENTION

Figure 1A:
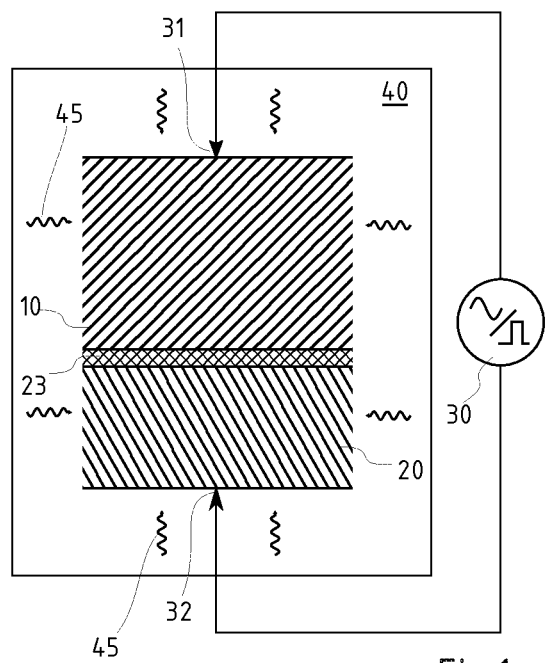
FIGS. 1a and 1b schematically illustrate two bonding devices for implementing the method of the invention.

In an embodiment which will be described in detail later, the method of the invention is applied to the fastening of a watch glass to a watch case or on a watch bezel. It should be understood, however, that the invention can also be applied to the assembly of any other object or component. The description will be better understood with reference to FIG. 1a which shows, in section, an assembly as described in an anode bonding device.

We choose an element of a watch case that should receive the glass, for example the bezel or the middle part; this element 20 can be manufactured with all the materials normally used for the production of watches. One can cite for example:
  stainless steel,
  gold, or gold-based alloys,
  platinum,
  titanium,
  ceramic,
this list is not exhaustive.

The element intended to receive the glass can be made by any known method, for example by machining, stamping, rolling, 3D printing, or any other method. It is important that the face in contact with the glass should be perfectly flat and free of asperities on a microscopic scale, in order to allow intimate contact. Depending on the needs and the nature of the materials used, this can be obtained by mechanical and/or electrochemical polishing for example.

The glass 10 is made of a suitable transparent material, for example:
  synthetic sapphire ($Al_2O_3$),
  mineral glass,
  quartz ($SiO_2$),
  transparent ceramic, for example:
    comprising Yttrium oxides (Yttralox®) or Yttria/Magnesia binary compounds,
    based on aluminum oxynitride spinels (Alone) or magnesium and aluminum oxides,
    other optical ceramics.

The contact surface of the glass is chemically or mechanically polished to perfectly match the corresponding surface of the bezel and/or the glass notch.

An intermediate layer 23 is then developed on the contact surface of the bezel 20, and/or of the glass 10. Preferably this is a thin layer deposited by a physical or chemical deposition process (PVD, PE-CVD, Sol-gel, electroplating). Very satisfactory results have been obtained by metal layers deposited by a PVD process, for example oxidized titanium layers, or by natural oxidation layers functionalized by oxygen-rich plasma.

It has been found that the method of the invention does not require a homogeneous chemical composition of the intermediate layer 23. On the contrary, layers with a chemical and/or oxidation gradient provided superior results in terms of adhesion, bond strength and assembly speed. According to one example, the intermediate layer 23 has a thickness between 1 nm and 10 μm and its composition varies from pure titanium, in the deeper regions, to oxide $TiO_2$ on the surface, passing through all the intermediate stoichiometry. As will be seen later, it is advantageous to accentuate this chemical gradient with exposures to a reactive plasma.

Several materials lend themselves to the deposition of the intermediate layer 23. Titanium layers, as has been said, have yielded excellent results, but the invention can be replicated with other materials, for example Zr, Hf, Fe, Si, Al, Cr, Ni, invar among others. The chemical gradient can be obtained by oxidation, nitriding, carburation, for example, so that the composition of the layer can be of the type $Ti_xO_y$, $Si_xO_y$, $Si_xN_y$, or $Al_xO_y$ type. The intermediate layer may be enriched by mobile atoms/ions such as Li, Na, K, Ca, Be, or halogens.

When the substrate is metallic, as is the case of a stainless steel bezel 20, the intermediate layer 23 may be a natural oxide layer, developing spontaneously following exposure to air, or forced, by exposure to a reactive atmosphere or plasma.

The intermediate layer 23 can be obtained, in variants of the invention, by a physical deposition process in a reactive atmosphere of variable composition. For example, a layer may be deposited by cathode pulverization (sputtering), in an inert atmosphere, in a first phase, and with a progressively increasing concentration of reactive gas (typically oxygen) afterwards. In this variant, the layer 23 is activated by exposure to a plasma chemically at the same time as it is deposited. By this method it is possible to obtain layers having the desired chemical gradient.

In possible variants, the intermediate layer may be an insert, for example a thin glass strip.

FIG. 1a shows very schematically an assembly device for performing the inventive method. The glass 10 is positioned on the upper face of the bezel 20 in an enclosure 40. Heating means 45 maintain the parts at a desired temperature. Typically, the invention proceeds at lower temperatures than conventional anode bonding methods. The temperature is preferably less than 250° C. Highly satisfactory results were obtained at temperatures of 200° C., 150° C., 100° C., and even 75° C. Under no circumstances will the temperature be close to that of melting or glass transition of the materials used.

The glass is connected to an electrode 31 and the bezel is connected to a counter electrode 32, to which a voltage source 30 is connected. The voltage source produces an electric field which causes an ion migration between the element 20, the layer 23 and the part 10.

Preferably, the voltage generated by the source 30 has a DC component (its average value or offset DC voltage) within the limits of what is generally used in anode bonding processes, i.e. in the range 0.1-15 kV, depending on the thickness of the parts to be joined and the dielectric strength of the assembly. According to the invention, it has been found that the quality of the bonding improves considerably when an AC or pulsed component is superimposed onto the DC component. The amplitude of the AC component or the height of the pulses will be comparable to that of the DC component, and the characteristic frequency will be greater than 100 Hz, for example 1 kHz, 10 kHz, or more. Characteristically, the characteristic frequency of the AC component or pulses will also be higher than the dielectric relaxation frequencies of the materials used.

If required, the parts 20, 10 can be mechanically compressed. However, it has been found that if the contact surfaces are meticulously polished and clean, such a plating is often superfluous. Assembly speeds are of the order of a few $mm^2$/minute.

Between the intermediate layer 23 and the substrate 20 thin layers can be deposited with an aesthetic or physical function such as anti-reflective functions (if the substrate 20 is transparent, for example), or to improve adhesion, or for any other purpose. These additional layers are not shown in the figures. The transition between the materials of the layers may be discontinuous or gradual.

Figure 1B:
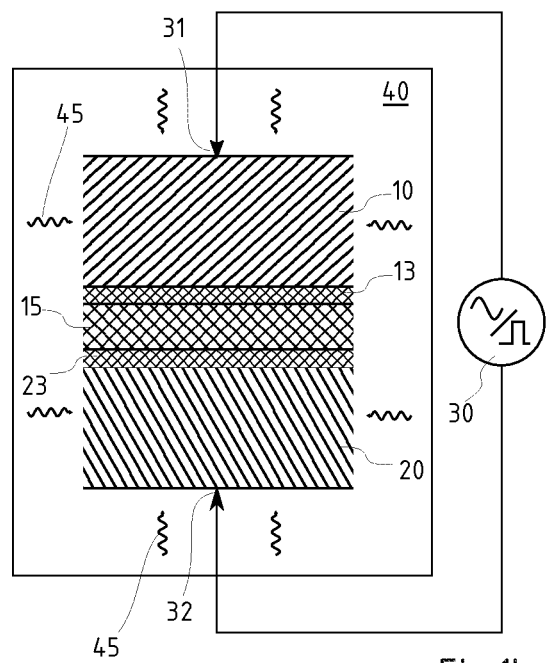

The method of the invention is not limited to the assembly of two elements. FIG. 1b schematically illustrates an assembly with an intermediate substrate 15 between the first element 10 and the second element 20. Intermediate layers 13, 23 are present at each interface. The number of superimposed elements can be increased at will.

Any charged particle placed under the influence of a uniform electric field moves at a rate proportional to this field, the proportionality factor being called the electric mobility of the particle. This migration will take place from the anode to the cathode for the positively charged particles, in the opposite direction for the negatively charged particles. Under the effect of the ion migration, a potential difference is observed between the elements 10, 20, which causes a plating between the partners induced by the effect of electrostatic forces. Disturbance of the thermodynamic balance influences populations of charge carriers located within the elements to be assembled and the intermediate layer. The origins of the disturbances can be:

doping inhomogeneities, impurities, structural defects and local deformations (mainly near the surface), contacts and junctions electric field forces temperature gradients.

The frequency applied to the electric field.

When the electric field and the temperature are interrupted, the charge carriers tend towards a state of equilibrium corresponding to permanent regimes defined by initial conditions and at the edges, according to typical mechanisms:

the diffusion of the carriers in concentration gradients the displacement of the carriers in internal electric fields the generation and recombination of carriers that may be intrinsic or involve recombination centers and traps.

The properties relating to electric currents and to the displacement of charge carriers under the influence of applied forces are called transport phenomena. Among the transport phenomena, mobility, whether it be for example gaps, impurities, charge carriers (the materials are differentiated by the Debye length of the majority carriers and their behavior is notably described by the continuity equation) as well as diffusion (based on Fick's laws) are the key mechanisms of anodic bonding.

The parameters that most influence the mobility of the charge carriers are the temperature and the volume number of impurities. Among the defects we can distinguish impurities and gaps. These are the same gaps, Schottky or Frenkel defects among others that facilitate the diffusion of charge carriers and which define the energy necessary for their diffusion. Moreover, moving a gap through a crystal requires much less work than constraining an ion to move through a dense ion network of a crystal. Ion conduction depends on the movement of the gaps. The impurities that contribute to charge carrier density are called "donors" if they provide extra electrons and "acceptors" if they bring extra holes. Note that the speed of the phenomenon of anode bonding depends on the amount of defects and the temperature in particular.

The choice of the intermediate layer or layers depends strongly on the "properties" of the charge carriers. The chemical composition of the layer or layers is naturally important since the transport phenomena depend on the characteristics of the atomic bonds. The bonds created during the anodic assembly process are predominantly covalent bonds. These strong bonds are established by pooling a pair of electrons from each of the charge carriers.

Other parameters have their importance such as the thickness of the parts to be assembled and the thickness of the depletion zone. Thickness limitations are dependent on glasses and glass tolerances and are comprised between 1-1000 nm.

Figure 2:
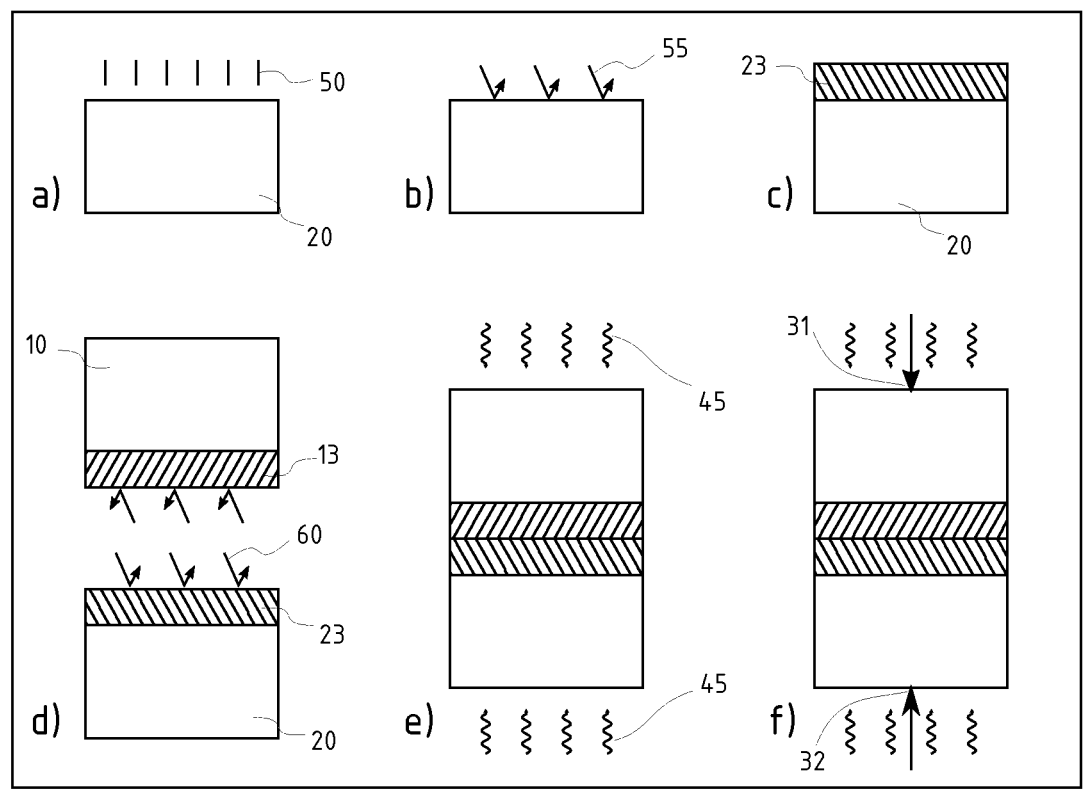
FIG. 2 illustrates steps of the inventive method.

FIG. 2 schematically represents a step sequence of the inventive method. The machined and polished part 20 is first cleaned (step a) by leaching baths, or by ultrasound, or by any suitable washing method. Then (step b) an intermediate PVD-deposition assembly layer 55 is created, as discussed above, or by any other suitable method. Step c) represents the element 20 with the activated intermediate layer 23 (the element 10 with another intermediate layer 13 is not shown in step c) of the figure).

The surface or surfaces to be joined are preferably activated by reactive plasma bombardment 60 (step d). The chemical and physical characteristics of the plasma will be chosen according to the desired chemistry for the intermediate layer. For example, oxygen plasmas applied to titanium or steel layers have given very satisfactory assemblies in terms of solidity and speed. The activation takes place, if possible, in the same reactor in which the deposition 55 is carried out.

The activated surfaces are sensitive to air, for this reason it is preferable to complete the assembly quickly after step d). The elements 10 and 20 are brought into contact and heated (step e), then the electric field is applied by the electrodes 31, 32 (step f) for a predetermined time, until the anode bonding.

It is often necessary to apply the intermediate layers 23, 13 selectively without completely covering the surface of the parts to be joined. It would not be conceivable to apply a layer of Ti/$TiO_2$ over the entire surface of a watch glass, for example, because these materials are not transparent. Selective assemblies are required by many other applications.

FIG. 3a illustrates a possibility of obtaining such an assembly. The part 20 is initially partially covered by a perforated protective coating 70 which partially covers the surface, leaving exposed only the regions to be joined. The protective coating or mask 70 can be made by the application of photosensitive resins, or by any other suitable method.

In the next step, a thin layer 84 is deposited on the entire part. Preferably, the layer 84 also has the function of an intermediate layer for anode bonding. It can be homogeneous or comprise several stacked layers of heterogeneous chemical composition. The dissolution or the chemical etching of the mask 70 leaves on the surface protruding regions 90 which will serve as anchoring for the bonding.

The element 10 is superimposed, and the bonding is carried out by application of an electric field and heat, as explained above. Preferably the electric field has a DC component and an alternating or pulsed component.

FIG. 3*b* illustrates a variant of the inventive process in which the selection of the regions to be treated is carried out by a method of selective etching of the substrate. Initially, the element 20 is masked by a protective coating 70 which covers only the regions to be joined. The unprotected regions undergo a selective attack, for example by a corrosive chemical bath, a plasma, an ion bombardment, a laser beam, or any other suitable means, leaving the protruding regions 90 intact.

The connection is completed by the superposition of the part 10 and the application of a controlled temperature electric voltage, as in the previous examples. Preferably, the electric field has a DC component and an alternating or pulsed component.

In the example shown, the intermediate layer 13 is deposited on the element 10 and covers its entire surface. In an alternative embodiment, not shown in the figure, it could be deposited selectively on the part 20, for example before the deposition of the mask 70.

Assembly Example

Figure 4:
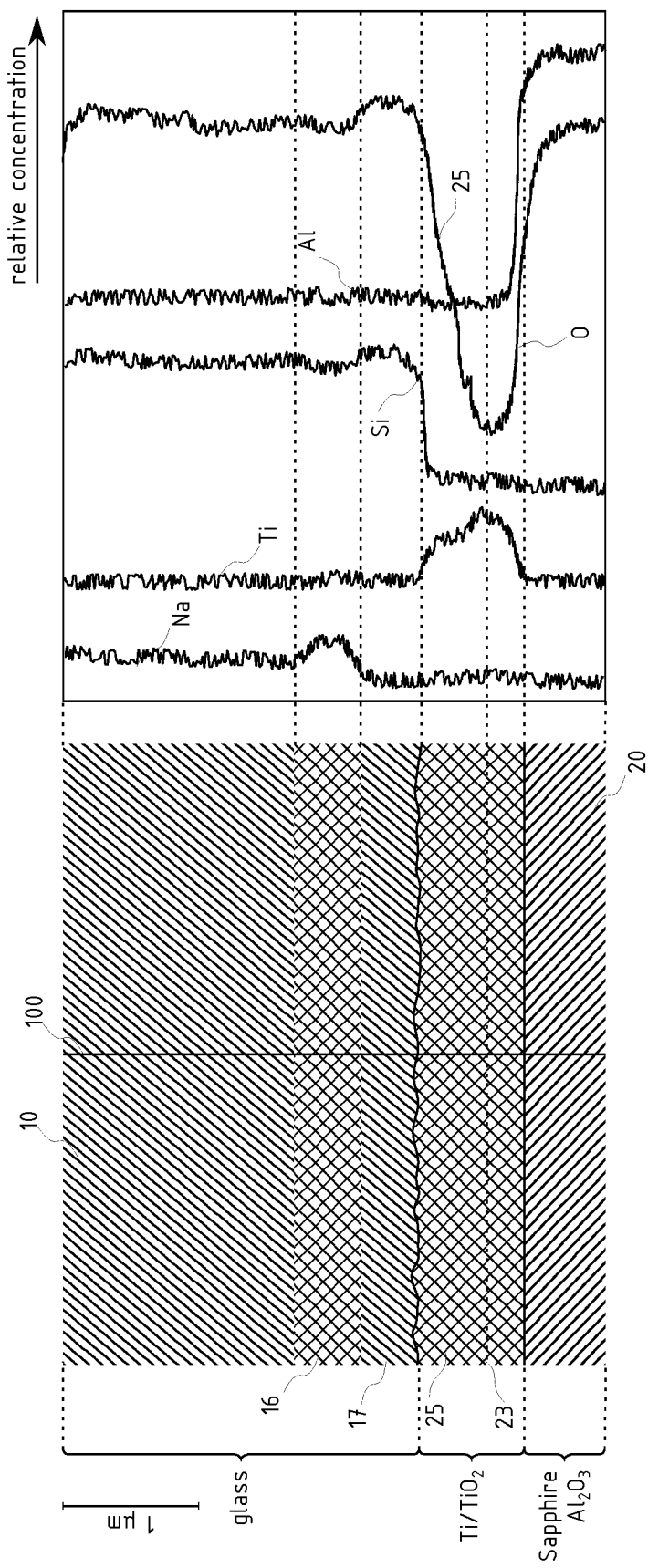
FIG. 4 shows schematically and in a simplified way the section of a bonding made by the method of the invention and the concentration profiles of certain chemical elements.

FIG. 4 is a simplified representation of a section of an assembly between a glass strip 10 of 500 micrometers of thickness and a sapphire strip 20. Prior to assembly, an intermediate layer of titanium 23 was deposited by a cathode sputtering process on the sapphire, for a total thickness of about one micrometer.

The deposition of the intermediate layer 23 took place first in an inert atmosphere (for example argon), and thereafter in the presence of a progressively increasing concentration of oxygen. The chemical composition of the intermediate layer continuously changes from pure titanium to titanium oxide $TIO_2$ (region 25), passing through all intermediate stoichiometry.

The assembly was then obtained by the application of an electric field comprising a continuous component −2.4 kV (polarity of the electrode applied to the glass strip 10) superimposed on a component pulsed in square wave of 1.2 kV to 1 kHz for 12.5 minutes at 200° C.

FIG. 4 was obtained from an SEM-EDX analysis (Scanning Electron Microscope-Energy Dispersive X-ray analysis) of a slice of the assembly. This technique makes it possible to obtain information on the chemical nature of the analyzed layers. The box on the right of FIG. 4 shows the concentration profiles of different atomic species. It should be noted that the concentration diagrams are not all on the same scale, and have been shifted to improve readability.

The diagrams clearly show the presence of a chemical oxidation gradient inside the intermediate layer 23 and a sodium-rich zone, due to the migration of the Na ions in the glass under the effect of the electric field, which is characteristic of anode bonds.

REFERENCE NUMBERS USED IN THE FIGURES

10 first element
13 intermediate layer of the first element
15 intermediate substrate
16 sodium-enriched layer
7 sodium-depleted layer
20 second element
23 intermediate layer of the second element
25 oxidation gradient
30 voltage source
31 electrode
32 electrode
40 enclosure
45 heating
50 washing
55 deposition
60 surface activation
70 mask
84 deposition
86 ablation
90 active site
100 scansion line

The invention claimed is:

1. An anodic bonding method between a first substrate and a second substrate comprising:
   interposing an intermediate layer between the first and second substrates;
   assembly of the substrates at a determined bonding temperature;
   application of an electric voltage between the first and the second substrate,
   wherein said electric voltage comprises a pulsed or AC component with a frequency greater than 100 Hz, and in that said bonding temperature is less than 300° C.

2. The anodic bonding method of claim 1, wherein said electric voltage comprises a DC component.

3. The anodic bonding method of claim 1, wherein said bonding temperature is less than 200° C.

4. The anodic bonding method of claim 1, wherein said intermediate layer is a glass layer.

5. The anodic bonding method of claim 4, wherein the intermediate layer exhibits a chemical gradient and/or an oxidation gradient.

6. The anodic bonding method of claim 1, wherein said intermediate layer is a titanium oxide layer.

7. The anodic bonding method of claim 6, comprising a step of deposition of an oxidizable layer on one of the substrates, followed by an oxidation step.

8. The anodic bonding method of claim 1, comprising a step of functionalizing said intermediate layer with a reactive plasma.

9. The anodic bonding method of claim 8, wherein the reactive plasma includes oxygen.

10. The anodic bonding method of claim 1, wherein said first substrate is metallic, and said second substrate is a ceramic, or a glass, or a crystalline insulating material.

11. The anodic bonding method of claim 10, wherein the first substrate is made of steel, or stainless steel, or titanium, or gold, or aluminum, or platinum or an alloy thereof.

12. The anodic bonding method of claim 10, wherein the second substrate is a synthetic sapphire.

* * * * *